United States Patent [19]
Girard et al.

[11] Patent Number: 5,870,278
[45] Date of Patent: Feb. 9, 1999

[54] ASSEMBLY OF ELECTRICAL EQUIPMENT, NOTABLY A MOTOR STARTER ASSEMBLY

[75] Inventors: Michel Girard, Corcelles-Les-Citeaux; Emmanuel Latour, Talant; Didier Sibille, Dijon, all of France

[73] Assignee: Schneider Electric SA, Boulogne Billancourt, France

[21] Appl. No.: 53,049

[22] Filed: Apr. 1, 1998

[30] Foreign Application Priority Data

Apr. 1, 1997 [FR] France .................................. 97 04042

[51] Int. Cl.[6] ........................................................ H02B 1/26
[52] U.S. Cl. ........................ 361/627; 361/600; 361/601; 361/622; 361/625; 361/631; 361/632; 361/634; 200/307; 307/147
[58] Field of Search .................................... 361/600, 601, 361/605, 610, 614, 627, 622, 632, 643, 102; 200/307, 50.26, 50.27; 307/147

[56] References Cited

U.S. PATENT DOCUMENTS 5,652,420  7/1997  Innes et al. ............................ 200/50.32

FOREIGN PATENT DOCUMENTS

| 0 407 241 A1 | 1/1991 | European Pat. Off. . |
| 0 588 712 A1 | 3/1994 | European Pat. Off. . |
| 19 44 236 | 3/1971 | Germany . |
| 295 07 456 U1 | 8/1995 | Germany . |

Primary Examiner—Leo P. Picard
Assistant Examiner—Boris L. Chervinsky
Attorney, Agent, or Firm—Oblon, Spivak, McClelland, Maier & Neustadt, P.C.

[57] ABSTRACT

A motor starter assembly made up of sub-assemblies each formed from a circuit breaker 40 and a contactor 60 and positioned on a baseplate 20 with which a set of power bars 23 is associated. The baseplate includes a support area 21 for the sub-assemblies and a connection are preferably a bracket 22 that is overhanging in relation to the support area. The baseplate further includes power connection elements and or control connection elements provided on the bracket and the connection area to permit plugging in of the sub-assemblies on the baseplate along an engagement direction Z approximately parallel with the support area and perpendicular to a direction X of a set of bars.

16 Claims, 7 Drawing Sheets

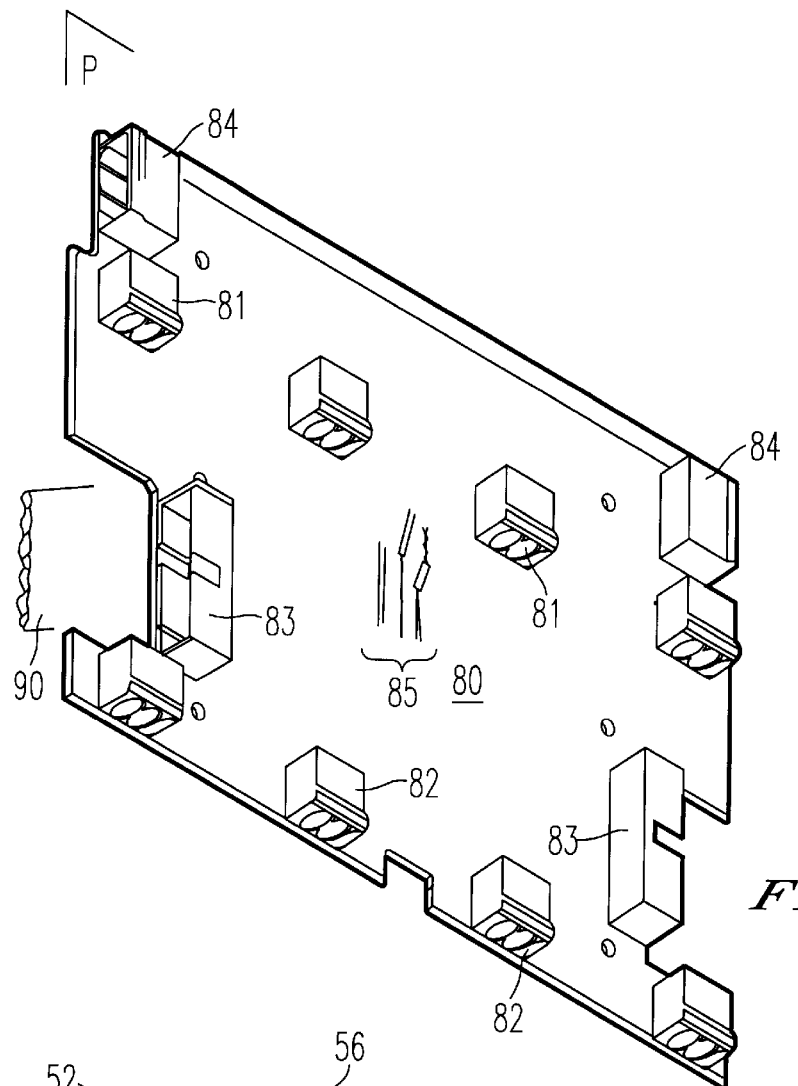
FIG. 6
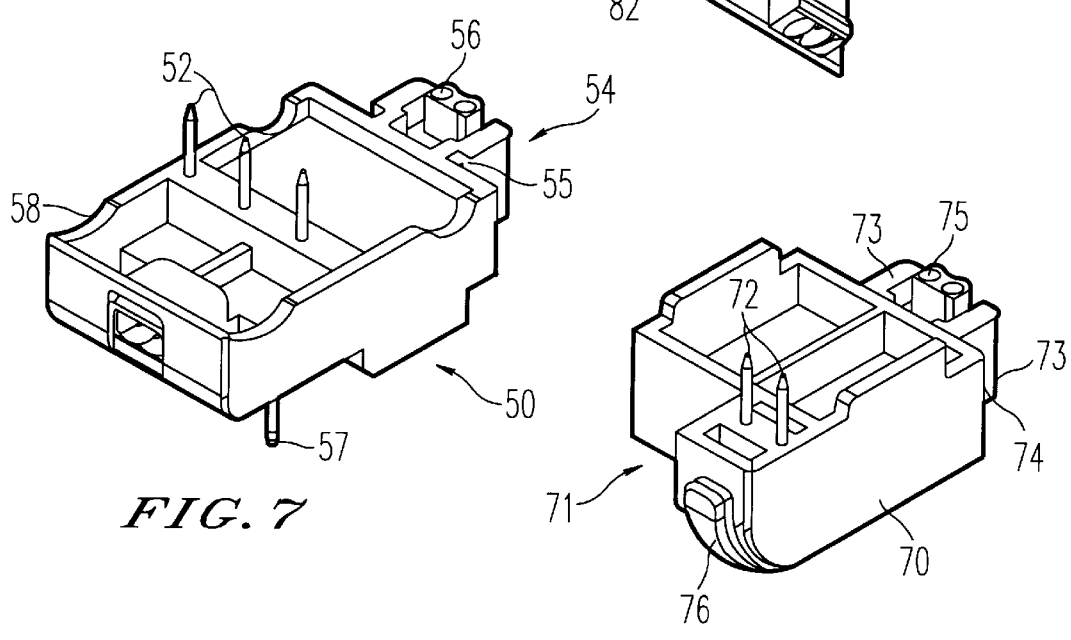
FIG. 7
FIG. 8

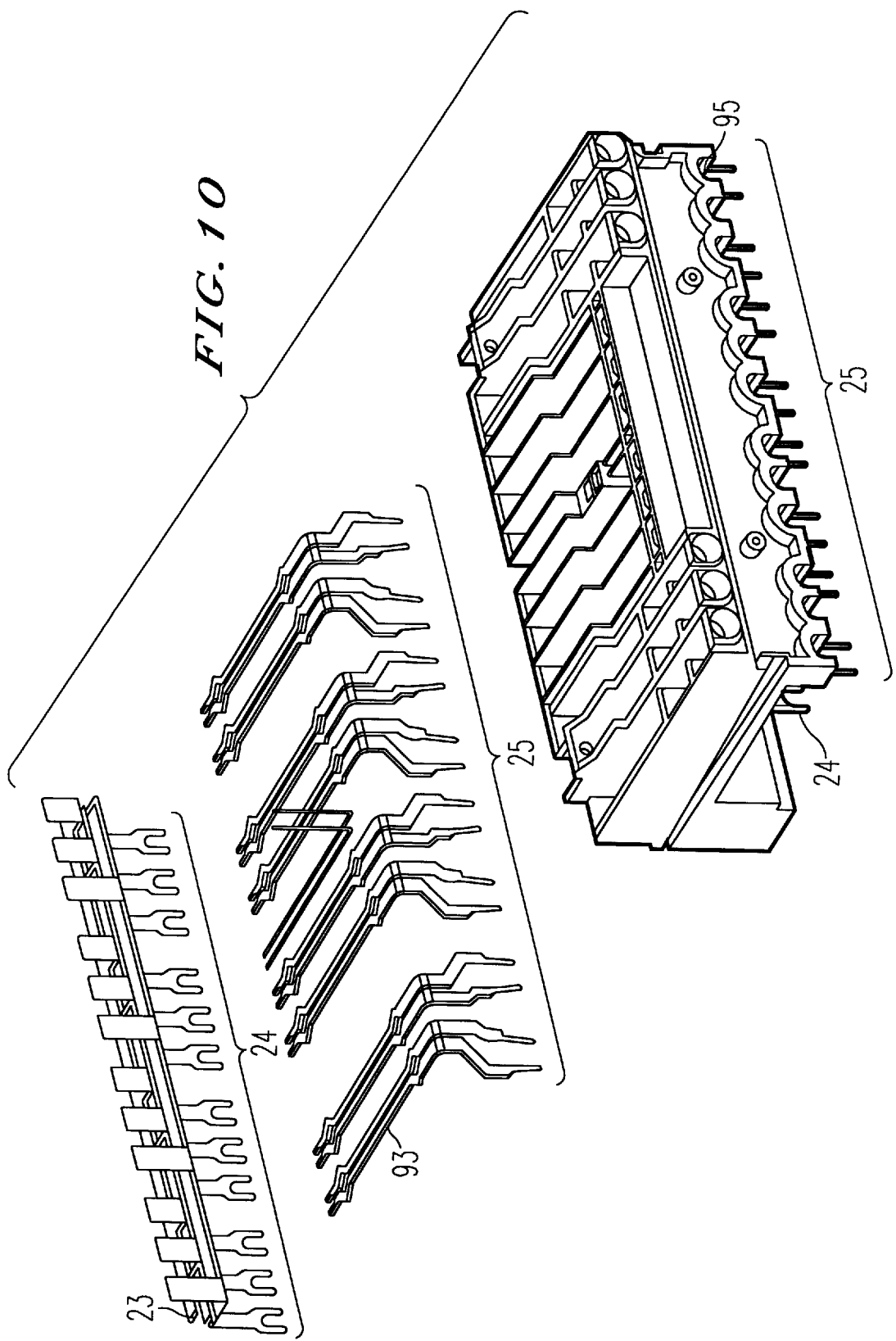

ASSEMBLY OF ELECTRICAL EQUIPMENT, NOTABLY A MOTOR STARTER ASSEMBLY

BACKGROUND OF THE INVENTION

1. Field of the Invention

This invention relates to an assembly of electrical equipment for the power control of loads, notably motor starter devices, this assembly comprising a baseplate and a set of power conductors provided to supply power to the loads, for each load, a pair of devices mounted on the baseplate and made up of a circuit breaker and a contactor, the pairs of devices being capable of being placed side by side on the baseplate.

2. Discussion of Background

Such an equipment assembly is used to supply power to a load such as a motor, in order to start it or when it is stopped according to the power up or power down of control conductors of the contactor; the circuit breaker is attached to the contactor in order to cut the power supply lines of the contactor when it detects, by means of suitable monitoring devices, an operational anomaly, for example an overcurrent in at least one of these lines.

Known motor starter assemblies include baseplates fitted with a length of section for supporting the circuit breaker and a length of section for supporting the contactor; the operator must wire up the contactor with the circuit breaker, connect this to the set of bars and wire up the control conductors to the corresponding terminals of the contactor and possibly to a signalling auxiliary contact deck which is attached to the circuit breaker and which opens the control circuit in the event that the circuit breaker is triggered. The wiring and mounting operations which this involves are long and tedious. It is on the other hand desirable to be able to group together several contactor-circuit breaker assemblies in a single device, particularly when these assemblies must be connected to a control bus.

SUMMARY OF THE INVENTION

The aim of the invention is to simplify the assembly and disassembly operations of several pairs of devices of the contactor-circuit breaker type and to reduce the wiring operations for these devices, while at the same time facilitating their connection to the control conductors, for example, to a control bus. The word "control" is used here in the broad sense and denotes both the command of the devices in the assembly and the condition signalling for this equipment or the command of other pieces of equipment according to their condition.

According to the invention, the baseplate comprises, on the one hand, a support area to receive several pairs of devices and on the other hand power and control pins that co-operate with the respective power and control terminals of the pairs of devices, and one of the devices is engaged with the power connection pins and the control connection pins of the baseplate along an engagement direction that is approximately parallel to the support area.

Preferably, the pairs of devices are assembled in a unitary fashion on the baseplate along the aforesaid direction, by means of at least one associated unit equipped with a fitting device that co-operates with a housing provided with abutments or retaining shoulders and provided on or in the baseplate.

The baseplate can comprise a bracket extending from the support area and overhanging in a direction perpendicular to the support area to house the set of power conductors and having plug-in connectors to co-operate with the circuit breaker or a signalling auxiliary contact deck attached to the circuit breaker, for each pair of devices; the baseplate can also house behind the support area, a printed circuit fitted, for each pair of devices, with tracks for the interconnection of the contactor coil with a control bus and corresponding connectors.

It is advantageous that the contactor be linked to the circuit breaker by means of an intermediate power interconnection unit which is provided with a fitting device that co-operates with a corresponding fitting device provided on or in the baseplate and which includes, on the one hand, power interconnection pins between the contactor and the circuit breaker and on the other hand plug-in elements that co-operate with complementary connection elements provided on the baseplate. On the other hand, an end unit can be fixed under the contactor, this end unit being equipped with a fitting device which co-operates with a corresponding fitting device provided on or in the baseplate and which includes pins for interconnecting with the control terminals of the contactor. The fitting devices of the baseplate are preferably housings created in the support area of the baseplate in order to provide guiding, holding and abutment elements for the pairs of devices. An immobilisation device can be joined onto the intermediate or end unit linked to the pair of devices in order to prevent it from being displaced in a direction opposite to its direction of engagement.

BRIEF DESCRIPTION OF THE DRAWINGS

A more complete appreciation of the invention and many of the attendant advantages thereof will be readily obtained as the same becomes better understood by reference to the following detailed descriptions when considered in connection with the accompanying drawings, wherein:

FIG. 6 shows the printed circuit of the baseplate in perspective.

FIGS. 7 and 8 show, in perspective from above details of the intermediate unit and the end unit.

FIG. 10 represents an exploded view of the bracket of a variant of the baseplate with two units.

DESCRIPTION OF PREFERRED EMBODIMENTS

Figure 1:
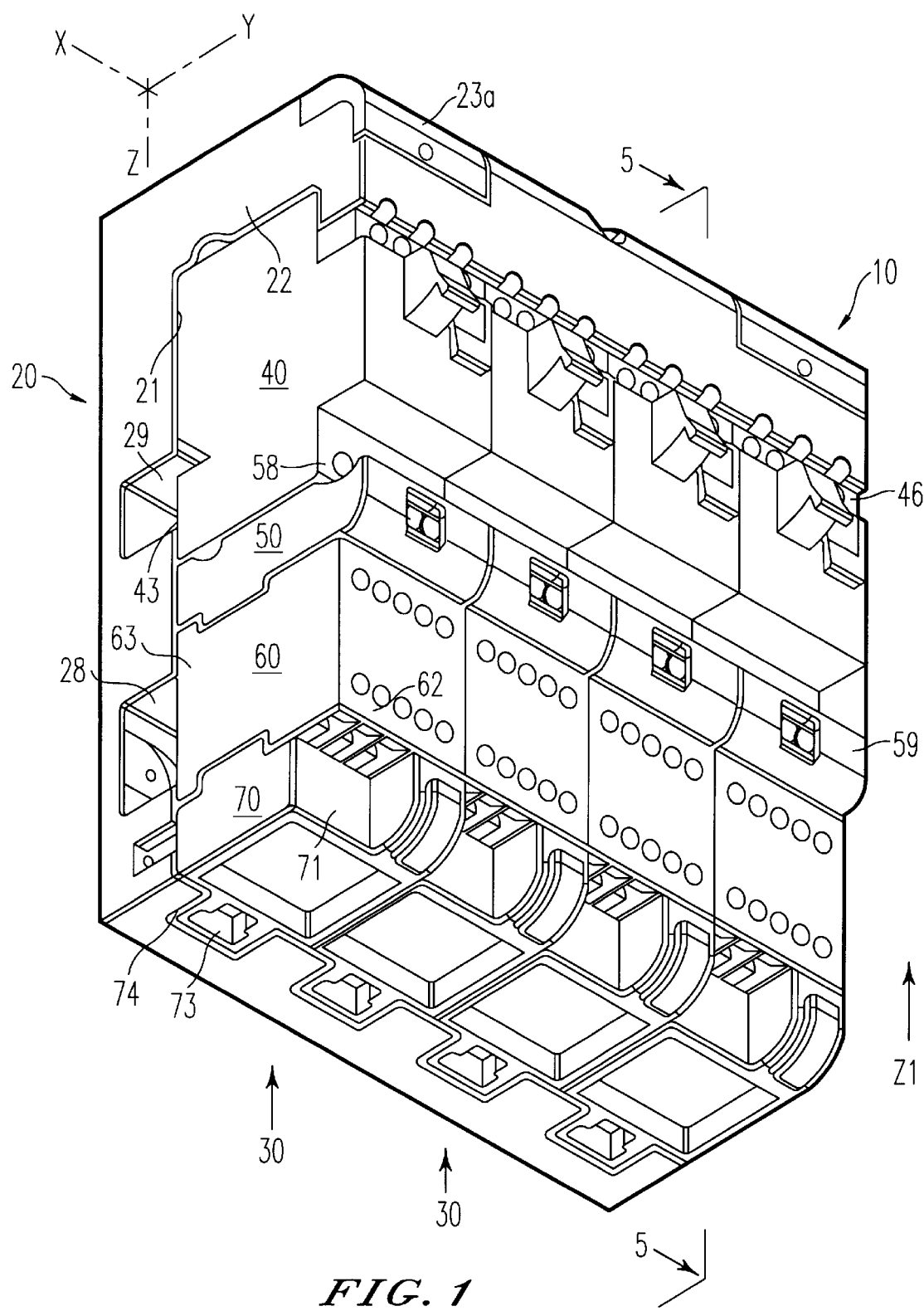
FIG. 1 represents in perspective a motor starter assembly conforming to the invention.
Figure 2:
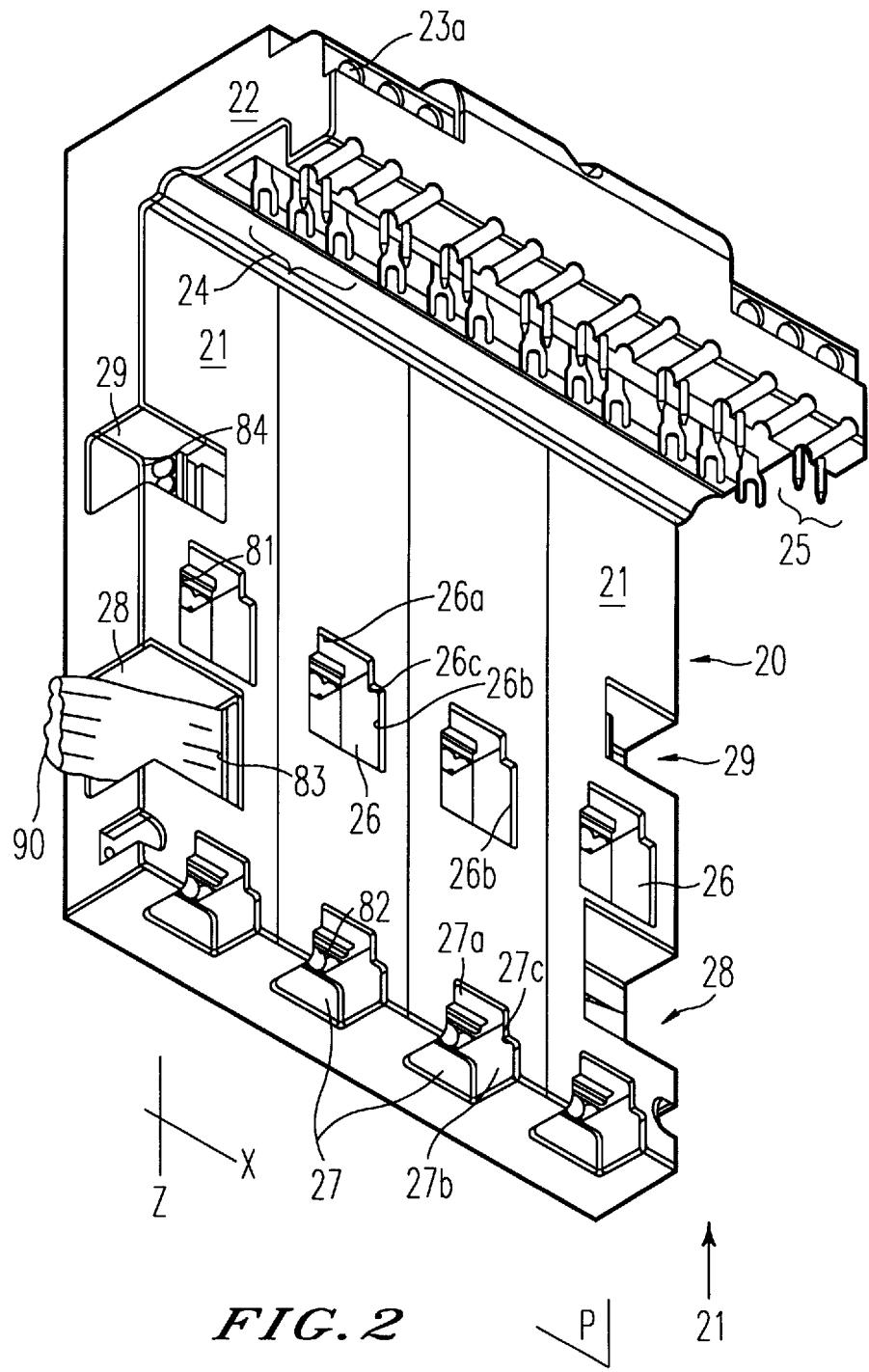
FIG. 2 represents in perspective the same assembly with the contactor and circuit breaker units removed.
Figure 3A:
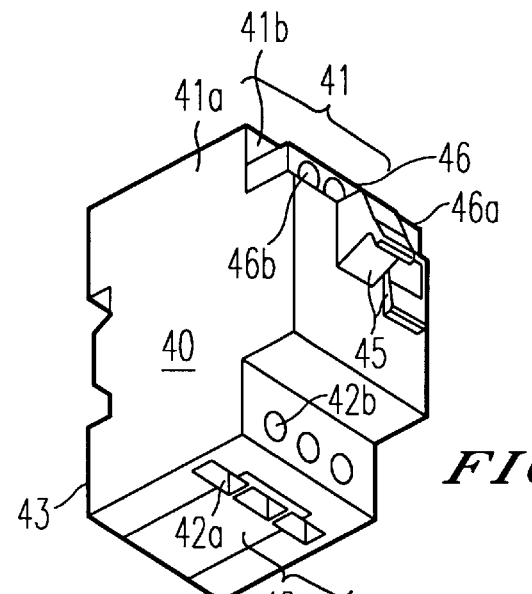
FIG. 3 shows such a unit in exploded perspective view.
Figure 3B:
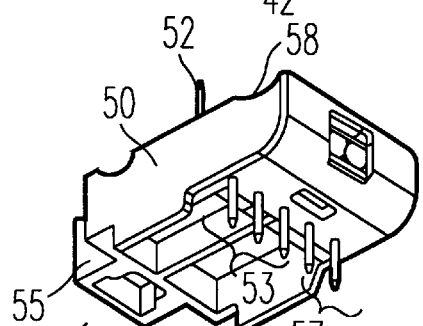
Figure 3C:
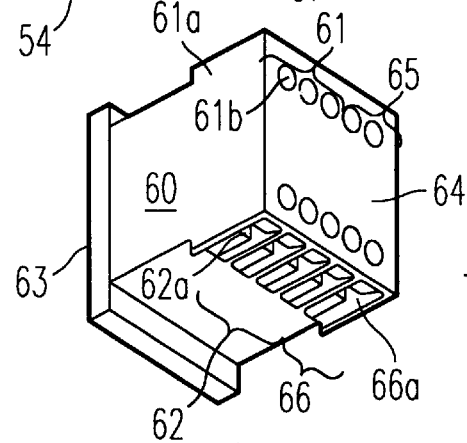
Figure 3D:
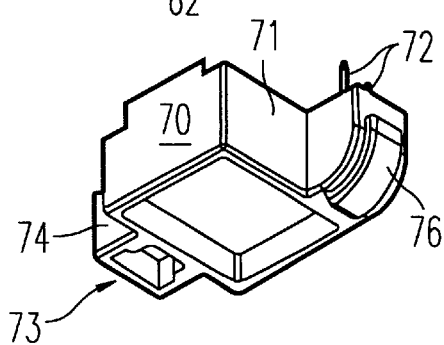
Figure 5:
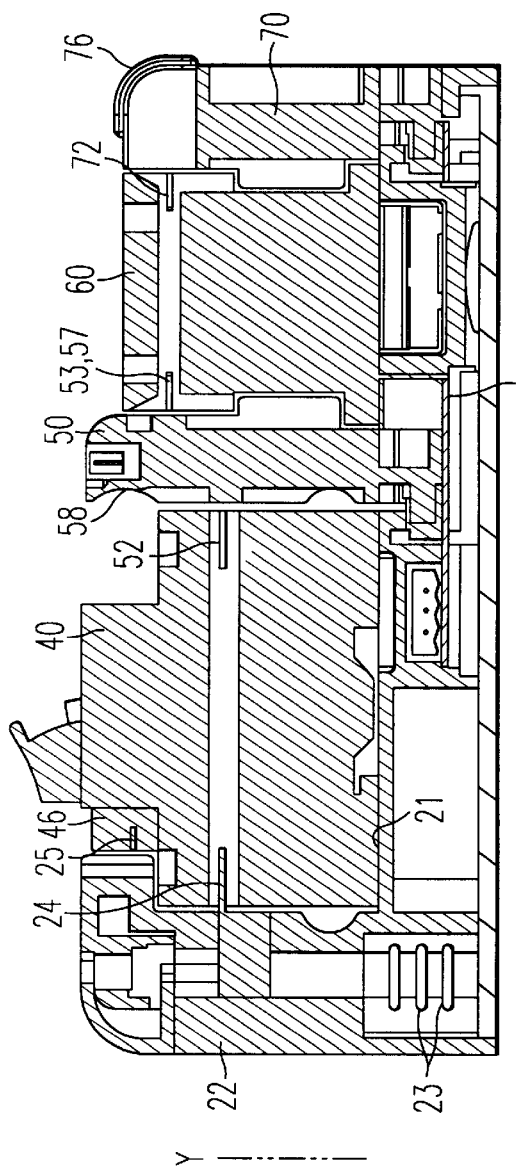
FIGS. 4 and 5 show the assembly of FIG. 1, respectively in a side view and in section along V—V.
Figure 4:
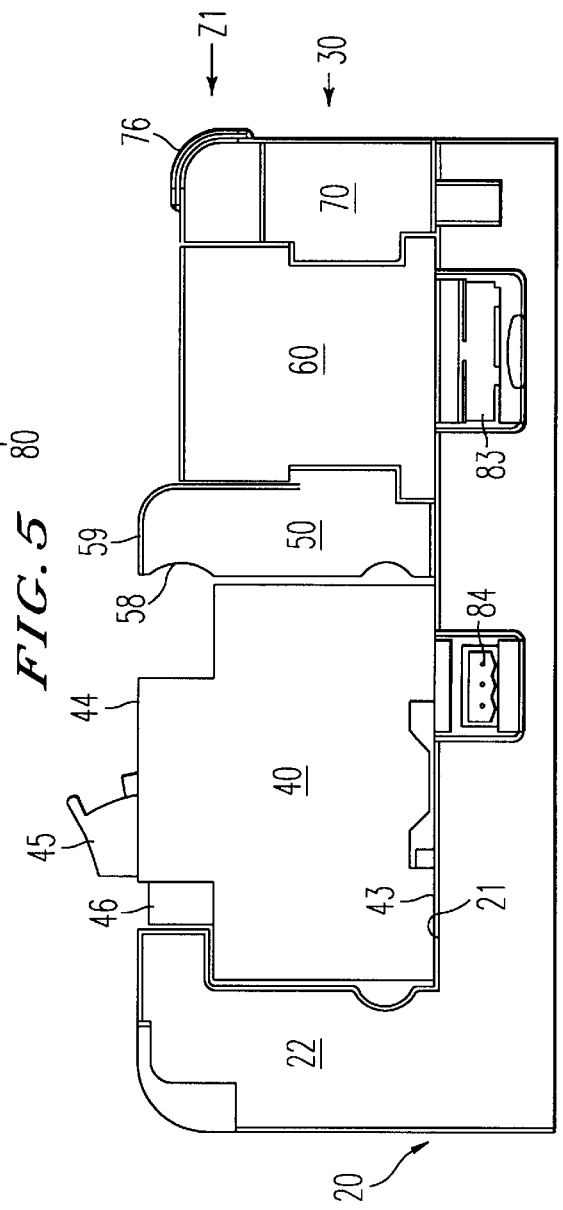

Referring now to the drawings, wherein like reference numerals designate identical or corresponding parts throughout the several views, and more particularly to FIG. 1 thereof, there is illustrated a motor starter assembly according to the present invention.

In FIG. 1, the device shown is a motor starter assembly with four units but it is obvious that it can include a different number of starter units, for example one, two or eight. Similarly, the device can be assembled and connected by any of the usual means to a neighbouring device.

The motor starter assembly 10 includes a baseplate 20 on which are housed and connected starter sub-assemblies 30.

Each sub-assembly includes a pair of electrical devices and two associated connection units, namely a circuit breaker 40, an intermediate unit 50, a contactor 60 and an end unit 70. The baseplate 20 can be fixed at the rear to a support by the usual fixing means: clip-on elements, screws, etc.

The baseplate 20 includes a body of small depth fitted with a front support area 21 generally parallel to a plane P to support the sub-assemblies 30 and to provide the interconnections between their components and, projecting from the body along a direction Y perpendicular to the plane P, an upper overhang 22 in the shape of a bracket; the baseplate houses a set of power supply conductors 23, for example bars, which extend along a general direction X parallel to P and are connected on the one hand to a power supply connection 23a at the side or, as shown, at the front and on the other hand to power connection pins 24; the bracket 22 also has control connection pins 25; the pins 24 and 25 extend along a direction Z parallel to P and perpendicular to X and Y. The baseplate 20 houses a printed circuit 80 which is parallel to P and provides the control interconnections via connectors 81,82 and the external control connection via the side connectors 83; the printed circuit 80 will be described further below.

The circuit breaker enclosure has upstream 41 and downstream 42 terminals, accessible for connecting flexible or rigid conductors through the respective orifices 41a and 42a and with handling tools through the frontal orifices 41b, 42b. The circuit breaker 40 has a rear face 43 and jutting out towards the front, a nose 44, fitted with at least one manual opening/closing command button 44a. On the nose of the circuit breaker, a signalling auxiliary contact deck 45 is arranged, fitted with terminals 46; the terminals 46 include access at the top 46a for the connection of the pins 26 and front orifices 46b for handling these terminals.

The contactor enclosure 60 has upstream 61 and downstream 62 power terminals accessible for the connection of flexible or rigid conductors through upper orifices 61a and lower orifices 62a and with handling tools, onto a front face 64, through front orifices 61b,62b; the contactor enclosure 60 also has a rear face 63 and next to the upstream 61 and downstream 62 power terminals, upstream 65 and downstream 66 control terminals with their respective access orifices 65a,66a. Depending on the situation, the coil of the contactor is connected to two upstream control terminals or to one upstream control terminal and one downstream control terminal.

The intermediate unit 50 is of small height and includes power interconnection conductors 51 between circuit breaker and contactor, terminated by pins 52 in order to co-operate with the downstream terminals 42 of the circuit breaker 40 and by pins 53 in order to co-operate with the upstream terminals 61 of the contactor 60. The intermediate unit 50 comprises, in addition, at the rear, a fitting and connecting heel 54; this heel is provided on the one hand with shapes 55 that can be fitted into a housing 26 of the baseplate in order to co-operate with a top abutment face 26a, side abutment faces 26b and retaining shoulders 26c towards the front; the heel 54 is on the other hand fitted with control connection elements 56 directed along Z and co-operating with the connector 81 arranged on the printed circuit and accessible at the bottom of the housing 26. The lower control pins 57 adjacent the power pins 53 are arranged in order to connect to the upstream control terminals 65 of the contactor 60.

It should be noted that the intermediate unit 50 has in its upper part, shapes 58 capable of been gripped by the fingers of the operator in order to facilitate the displacement of the sub-assembly along Z for its assembly and disassembly.

The end unit 70 provides through a void 71, passage for power conductors intended to connect the downstream terminals 62 of the contactor 60 to the load; the unit 70 includes control pins 72 to be connected to the downstream control terminals 66 of the contactor and a fitting and connecting heel 73. This heel is provided on the one hand with fitting shapes 74 to co-operate with the shapes and walls of a housing 27 in the baseplate, in particular with a top abutment 27a, side abutments 27b and front retaining shoulders 27c. The heel 73 is, on the other hand, fitted with control connection elements 75 directed along Z and co-operating with a connector 82 provided in the bottom of the housing 27. A catch 76 controlling the elements that clip the unit 70 into the housing 27 can, on the other hand, be provided at the front of the unit 70 in order to strengthen the immobilisation of the sub-assembly on the baseplate.

The baseplate 20 includes, in addition to the housings 26,27 and the associated connectors 81,82, side housings 28 that include connectors 83 to provide the connection for the connectors to which are connected the control conductors and/or command conductors 90 which provide the link with a process controller or form part of an area bus. Extra side housings 29 including connectors 84 are provided for the connection of power supply conductors to be connected to relays provided on the printed circuit 80 when voltage amplification is desired.

It will be noted that the support area 21 is approximately flat, with the exception of the parts set back which form the housings 26–29, in such a way that, after insertion approximately along Y, of the heels 54,73, the intermediate 50 and the end unit 70, the sub-assemblies 30 can be engaged and connected along the direction Z parallel to the plane P of the support area 21, and this without any need for wiring up. The rear faces 43,63 of the circuit breaker and the contactor are coplanar with the rear faces of units 50, 70. The front face 59 of unit 50 is projecting under the nose 44 in order to facilitate gripping the shapes 58.

The printed circuit 80 is illustrated separately in FIG. 6 so as to show better its connectors 81–84. The circuit 80 provides, with the help of tracks 85 the desired interconnections.

Figure 9:
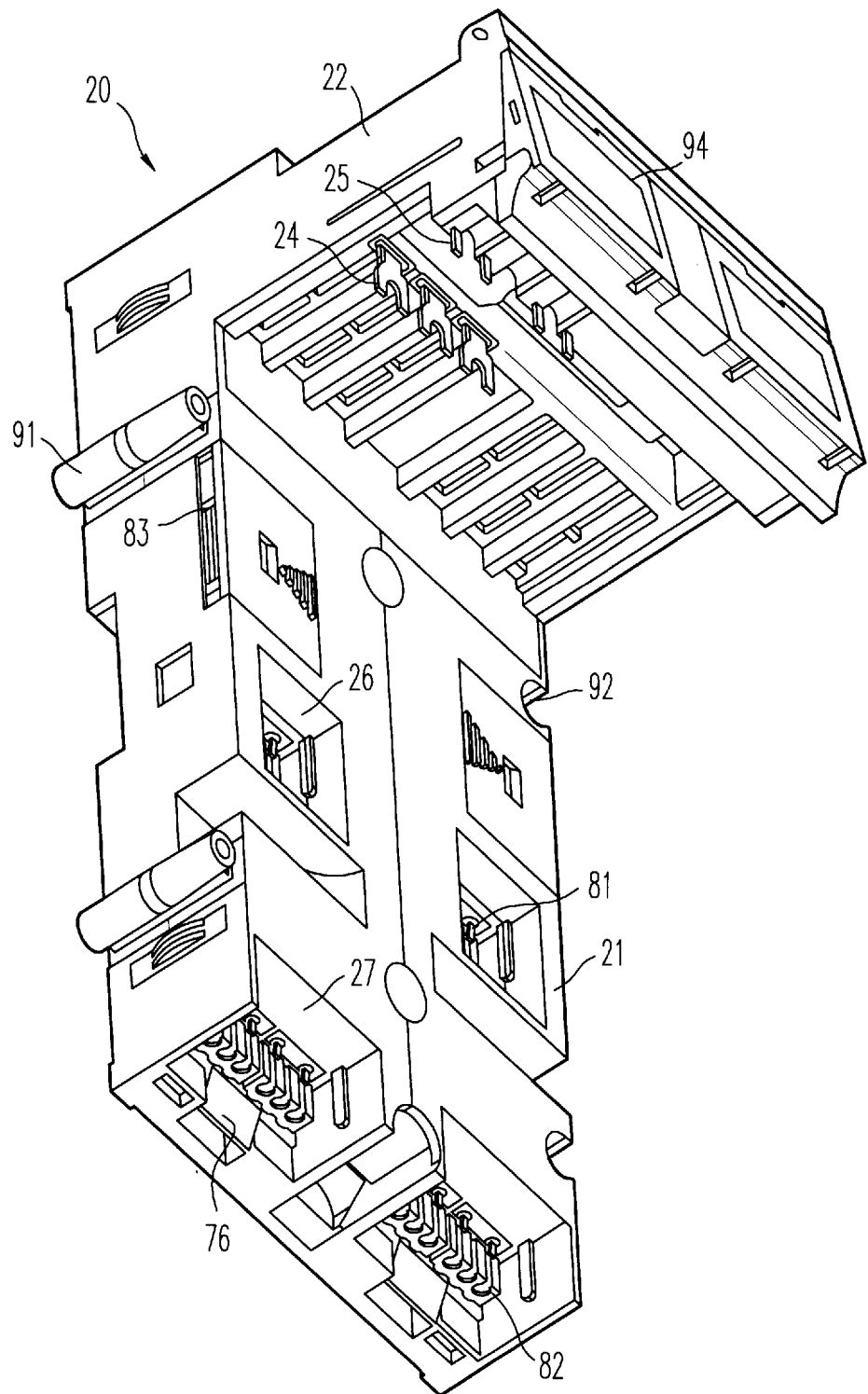
FIG. 9 shows in perspective from below an embodiment variant of the baseplate.

The baseplate 20 illustrated in FIG. 9 includes on the one side, lateral elements in relief 91 and on the other side complementary hollowed out elements 92, so as to assist the assembly of neighbouring baseplates. In FIG. 9 a variant of an elastic catch 76 can be seen provided in order to lock the lower unit 70 in position; actuation of the catch is carried out by means of a tool inserted into a channel passing through the end unit 70. The set of power supply bars 23, the pins 24 connected to these bars and the internal control conductors 93 which connect the pins 25 to the printed circuit are moulded into bracket 22 (see FIG. 10). A pivoting flap 94 capable of carrying labels associated with the various groups of devices is mounted at the front of the bracket 22 to conceal the inlets 95 to the orifices giving access to the circuit breaker terminals 40 and/or its auxiliary deck 45. The control terminals mentioned are the type that are clamped by a screw or by an elastic component.

The mounting of the sub-assemblies 30 onto the baseplate 20 of the device described is as follows.

The user begins by assembling the contactor 60 to the circuit breaker 40 through the intermediate unit 50 by on the one side plugging the pins 52 into the orifices 42a of the terminals 42 of the circuit breaker and on the other side plugging the pins 53 and 57 into the orifices 61a, 65a of the terminals 61, 65 of the contactor and tightening up the screws of the terminals. Then he assembles the end unit 70 to the contactor by inserting its pins 72 into the orifices 66a of terminals 66 of the contactor and tightening up the screws of these terminals. To mount the sub-assembly thus produced onto the baseplate 20, the user then engages the heels 54, 73 of units 50, 70 projecting from the back of the sub-assembly into the housings 26, 27 in the baseplate and then slides the sub-assembly in the direction Z along the support area 21. The sliding is carried out with lateral guide being provided by the walls 26b, 27b of the housings 26,27 until the power lugs 24 are located in the terminals 41 of the circuit breaker and the control pins 25 in the terminals 46 of its auxiliary contact deck 45. The elastic catch 76 engages and ensures the sub-assembly is held and resists any accidental displacement in the direction Z, while the abutments 26b, 27b retain the sub-assembly in the direction X and the shoulders 26c, 27c prevent it being pulled out of the baseplate in the direction Y. The unit 70 can also be joined on and connected to the baseplate after mounting the devices 40 and 60 with their connecting unit 50.

As a variant, the intermediate unit 50 can first be assembled to the circuit breaker 40, then the circuit breaker engaged along the direction Z and connected to the pins 24, 25; the contactor is then engaged along Z and connected to the pins 53, 57 of unit 50 and the unit 70 is mounted and locks the assembly.

The power connection of the assembly to a source of energy is carried out by the appropriate connection of conductors to the front terminal block 23a. The control connection is carried out by the connection of individual cables or a cable bundle to the side connector 83.

To disassemble a sub-assembly, the user unscrews the terminal screws 41 of the corresponding circuit breaker, then unlocks the catch 76 and grasps the shapes 58 of the intermediate unit 50 and the underneath of the end unit 70, and pulls the sub-assembly downwards in the direction opposite to Z1, this movement been limited by the abutment of the heel 54 against the bottom of the housing 26, and finally extracts the sub-assembly from the baseplate in the direction X. To simply disassemble the contactor from a sub-assembly it is sufficient to unscrew the terminal screws 61 of the contactor, then to unlock the catch 76 and continue the operation as above.

It will be noted that when assembling, the wiring work which the user must carry out is considerably simplified since he must only initially connect the load to the power terminals of the contactor and the three phase power supply and the source of command voltage for the contactors. The addition of a neighbouring assembly is carried out by the side fitting of the male and female elements 91, 92 and the interconnection of the control connectors 83 and if the case arises 84 putting them facing one another and with power terminals adjacent 23a.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An electrical equipment assembly for the power control of at least one load, comprising:
   a baseplate adapted to receive, for each of said at least one load, a pair of devices adapted to be mounted on the baseplate, the pair of devices including a circuit breaker and a contactor, the baseplate including a set of power conductors,
   wherein:
   the baseplate is adapted so that the pair of devices are placed side by side on the baseplate,
   the baseplate includes a support area to receive the pair of devices and power pins and control pins that co-operate with respective power terminals and control terminals of the pair of devices,
   one of the devices of each pair of devices is engaged on the power pins and the control pins of the baseplate along an engagement direction which is approximately parallel to the support area, and
   for each pair of devices at least one fitting device extending form the pair of devices is provided which couples with at least one housing having abutments and retaining shoulders for the at least one fitting device and wherein the at least one housing is provided recessed on or in the baseplate.

2. The assembly according to claim 1, wherein the baseplate includes a bracket extending from the support area and overhanging in a direction perpendicular to the support area in order to house the set of power conductors, the bracket having connection pins which co-operate with the circuit breaker of the pair of devices.

3. The assembly according to claim 2, wherein the bracket has power supply conductors and internal control conductors molded therein which provide a link between the connection pins and a printed circuit housed in the baseplate.

4. The assembly according to claim 2, wherein the bracket has a flap to conceal the power terminals and control terminals.

5. The assembly according to claim 1, wherein the contactor includes a coil;
   the baseplate houses a printed circuit disposed behind the support area; and
   the printed circuit includes, for each pair of devices, control conductors, corresponding connectors, and interconnection tracks from the coil of the contactor to the control conductors and the corresponding connectors.

6. The assembly according to claim 1, wherein the contactor is linked to the circuit breaker by means of an intermediate unit which is equipped with the at least one fitting device that co-operates with a housing in the baseplate and which includes interconnection power pins between contactor and circuit breaker and control connection elements that co-operate with complementary connection elements provided on the baseplate.

7. The assembly according to claim 1, wherein an end unit is fixed under the contactor and is equipped with the at least one fitting device that co-operates with a housing in the baseplate and includes pins for interconnection with the control terminals of the contactor.

8. The assembly according to claim 1, wherein a catch is joined onto an intermediate unit or an end unit corresponding to the pair of devices to prevent the intermediate unit or the end unit from being displaced in a direction opposite to the engagement direction.

9. An electrical equipment assembly for the power control of at least one load, comprising:
   a baseplate adapted to receive, for each of said at least one load, a pair of devices adapted to be mounted on the baseplate, the pair of devices including a circuit breaker and a contactor, the baseplate including a set of power conductors, wherein:

the baseplate is adapted so that the pair of devices are placed side by side on the baseplate, the baseplate includes a support area to receive the pair of devices and power pins and control pins that co-operate with respective power terminals and control terminals of the pair of devices, one of the devices of each pair of devices is engaged on the power pins and the control pins of the baseplate along an engagement direction which is approximately parallel to the support area, and the baseplate includes a bracket extending from the support area and overhanging in a direction perpendicular to the support area in order to house the set of power conductors, the bracket having connection pins which co-operate with the circuit breaker of the pair of devices.

10. The assembly according to claim 9, wherein for each pair of devices at least one fitting device is provided extending form the pair of devices which couples with at least one housing having abutments and retaining shoulders for the at least one fitting device and wherein the at least one housing is provided recessed on or in the baseplate.

11. The assembly according to claim 9, wherein the bracket has power supply conductors and internal control conductors molded therein which provide a link between the connection pins and a printed circuit housed in the baseplate.

12. The assembly according to claim 9, wherein the bracket has a flap to conceal the power terminals and control terminals.

13. The assembly according to claim 9, wherein the contactor includes a coil;

the baseplate houses a printed circuit disposed behind the support area, and the printed circuit includes, for each pair of devices, control conductors, corresponding connectors, and interconnection tracks from the coil of the contactor to the control conductors and the corresponding connectors.

14. The assembly according to claim 9, wherein the contactor is linked to the circuit breaker by means of an intermediate unit which is equipped with the at least one fitting device that co-operates with a housing in the baseplate and which includes interconnection power pins between contactor and circuit breaker and control connection elements that co-operate with complementary connection elements provided on the baseplate.

15. The assembly according to claim 9, wherein an end unit is fixed under the contactor and is equipped with the at least one fitting device that co-operates with a housing in the baseplate and includes pins for interconnection with the control terminals of the contactor.

16. The assembly according to claim 9, wherein a catch is joined onto an intermediate unit or an end unit corresponding to the pair of devices to prevent the intermediate unit or the end unit from being displaced in a direction opposite to the engagement direction.

* * * * *